US 6,617,060 B2

(12) United States Patent
Weeks, Jr. et al.

(10) Patent No.: US 6,617,060 B2
(45) Date of Patent: Sep. 9, 2003

(54) GALLIUM NITRIDE MATERIALS AND METHODS

(75) Inventors: T. Warren Weeks, Jr., Raleigh, NC (US); Edwin L. Piner, Cary, NC (US); Thomas Gehrke, Apex, NC (US); Kevin J. Linthicum, Angier, NC (US)

(73) Assignee: Nitronex Corporation, Raleigh, NC (US)

( * ) Notice: Subject to any disclaimer, the term of this patent is extended or adjusted under 35 U.S.C. 154(b) by 0 days.

(21) Appl. No.: 10/188,814

(22) Filed: Jul. 2, 2002

(65) Prior Publication Data

US 2002/0187356 A1 Dec. 12, 2002

Related U.S. Application Data

(63) Continuation of application No. 09/736,972, filed on Dec. 14, 2000.

(51) Int. Cl.[7] .......................... B32B 9/00; B32B 18/00; H01L 21/335
(52) U.S. Cl. ....................... 428/698; 428/336; 428/446; 428/689; 428/697; 438/142
(58) Field of Search ................................. 428/446, 688, 428/689, 697, 698, 336; 438/142

(56) References Cited

U.S. PATENT DOCUMENTS

| | | |
|---|---|---|
| 5,192,987 A | 3/1993 | Khan et al. |
| 5,239,188 A | 8/1993 | Takeuchi et al. |
| 5,290,393 A | 3/1994 | Nakamura |
| 5,296,395 A | 3/1994 | Khan et al. |
| 5,389,571 A | 2/1995 | Takeuchi et al. |
| 5,393,993 A | 2/1995 | Edmond et al. |
| 5,442,205 A | 8/1995 | Brasen et al. |
| 5,523,589 A | 6/1996 | Edmond et al. |
| 5,633,192 A | 5/1997 | Moustakas et al. |

(List continued on next page.)

FOREIGN PATENT DOCUMENTS

| | | |
|---|---|---|
| EP | 0514018 | 11/1992 |
| EP | 0 852 416 A1 | 7/1998 |

(List continued on next page.)

OTHER PUBLICATIONS

Hirosawa et al., "Growth of Single Crystal $Al_xGa_{1-x}N$ Films on Si Substrates by Metalorganic Vapor Phase Epitaxy," Jpn. J. Appl. Phys. vol. 32 (1993) pp 1039–1042 (No Month).

Pearsall, Thomas P. Volume Editor, "Strained–Layer Superlattices: Materials Science & Technology," Semiconductors and Semimetals, vol. 33, pp. 242–243, Department of Electrical Engineering, University of Washington, Seattle, Washington, Academic Press, Inc. 1991.

Primary Examiner—Deborah Jones
Assistant Examiner—G. A. Blackwell-Rudasill
(74) Attorney, Agent, or Firm—Wolf, Greenfield & Sacks, P.C.

(57) ABSTRACT

The invention provides semiconductor materials including a gallium nitride material layer formed on a silicon substrate and methods to form the semiconductor materials. The semiconductor materials include a transition layer formed between the silicon substrate and the gallium nitride material layer. The transition layer is compositionally-graded to lower stresses in the gallium nitride material layer which can result from differences in thermal expansion rates between the gallium nitride material and the substrate. The lowering of stresses in the gallium nitride material layer reduces the tendency of cracks to form. Thus, the invention enables the production of semiconductor materials including gallium nitride material layers having few or no cracks. The semiconductor materials may be used in a number of microelectronic and optical applications.

75 Claims, 10 Drawing Sheets

U.S. PATENT DOCUMENTS

| | | | |
|---|---|---|---|
| 5,679,965 A | | 10/1997 | Schetzina |
| 5,739,554 A | | 4/1998 | Edmond et al. |
| 5,741,724 A | | 4/1998 | Ramdani et al. |
| 5,760,426 A | | 6/1998 | Marx et al. |
| 5,786,606 A | | 7/1998 | Nishio et al. |
| 5,815,520 A | | 9/1998 | Furushima |
| 5,821,555 A | | 10/1998 | Saito et al. |
| 5,838,029 A | | 11/1998 | Shakuda |
| 5,838,706 A | | 11/1998 | Edmond et al. |
| 5,874,747 A | * | 2/1999 | Redwing et al. ............... 257/77 |
| 5,880,491 A | | 3/1999 | Soref et al. |
| 6,039,803 A | | 3/2000 | Fitzgerald et al. |
| 6,045,626 A | | 4/2000 | Yano et al. |
| 6,051,849 A | | 4/2000 | Davis et al. |
| 6,060,331 A | | 5/2000 | Shakouri et al. |
| 6,064,078 A | | 5/2000 | Northrup et al. |
| 6,069,021 A | | 5/2000 | Terashima et al. |
| 6,100,545 A | | 8/2000 | Chiyo et al. |
| 6,120,600 A | | 9/2000 | Edmond et al. |
| 6,121,121 A | | 9/2000 | Koide |
| 6,139,628 A | | 10/2000 | Yuri et al. |
| 6,146,457 A | | 11/2000 | Solomon |
| 6,177,688 B1 | | 1/2001 | Linthicum et al. |
| 6,201,262 B1 | | 3/2001 | Edmond et al. |
| 6,255,198 B1 | | 7/2001 | Linthicum et al. |
| 6,261,929 B1 | | 7/2001 | Gehrke et al. |
| 6,261,931 B1 | | 7/2001 | Keller et al. |
| 6,265,289 B1 | | 7/2001 | Zheleva et al. |
| 6,329,063 B2 | | 12/2001 | Lo et al. |
| 6,380,108 B1 | | 4/2002 | Linthicum et al. |
| 6,403,451 B1 | | 6/2002 | Linthicum et al. |
| 6,426,512 B1 | * | 7/2002 | Ito et al. ...................... 257/12 |
| 6,440,823 B1 | * | 8/2002 | Vaudo et al. ............... 438/478 |
| 2001/0008656 A1 | | 7/2001 | Tischler et al. |
| 2001/0042503 A1 | | 11/2001 | Lo et al. |
| 2002/0020341 A1 | | 2/2002 | Marchand et al. |

FOREIGN PATENT DOCUMENTS

| | | |
|---|---|---|
| EP | 0 942 459 A1 | 9/1999 |
| EP | 0 951 055 A2 | 10/1999 |
| JP | 11040847 | 2/1999 |
| JP | 11145514 | 5/1999 |
| WO | WO 9641906 | 12/1996 |
| WO | WO 00/33365 A1 | 6/2000 |
| WO | WO 01/27980 A1 | 4/2001 |
| WO | WO 01/37327 A1 | 5/2001 |
| WO | WO 01/43174 A1 | 6/2001 |
| WO | WO 01/47002 A2 | 6/2001 |
| WO | WO 01/59819 A1 | 8/2001 |

* cited by examiner

GALLIUM NITRIDE MATERIALS AND METHODS

CROSS REFERENCE TO RELATED APPLICATIONS

This application is a continuation of U.S. application Ser. No. 09/736,972, filed Dec. 14, 2000, and entitled "Gallium Nitride Materials and Methods," the disclosure of which is incorporated herein by reference.

FIELD OF INVENTION

The invention relates generally to semiconductor materials and, more particularly, to gallium nitride materials and methods of producing gallium nitride materials.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many microelectronic applications such as transistors, field emitters, and optoelectronic devices.

In many applications, gallium nitride materials are grown on a substrate. However, differences in the properties between gallium nitride materials and substrates can lead to difficulties in growing layers suitable for many applications. For example, gallium nitride (GaN) has a different thermal expansion coefficient (i.e., thermal expansion rate) than many substrate materials including sapphire, silicon carbide, and silicon. This difference in thermal expansion can lead to cracking of a gallium nitride layer deposited on such substrates when the structure is cooled, for example, during processing. The cracking phenomena can prevent gallium nitride materials from being suitable for use in many applications. Cracking can be particularly problematic for relatively thick (e.g., >0.5 micron) gallium nitride layers.

Gallium nitride (GaN) also has a different lattice constant than most substrate materials. The difference in lattice constant may lead to the formation of defects in gallium nitride material layers deposited on substrates. Such defects can impair the performance of devices formed using the gallium nitride material layers.

Prior art techniques have been developed to address crack formation and defect formation in gallium nitride materials deposited on sapphire substrates and silicon carbide substrates. Such techniques, for example, may involve depositing one or more buffer layers on the substrate and, then, depositing the gallium nitride material on the buffer layer(s).

SUMMARY OF INVENTION

The invention provides semiconductor materials including a gallium nitride material layer formed on a silicon substrate and methods to form the semiconductor materials. The semiconductor materials include a transition layer formed between the silicon substrate and the gallium nitride material layer. The transition layer is compositionally-graded to lower stresses in the gallium nitride material layer which can result from differences in thermal expansion rates between the gallium nitride material and the substrate. The lowering of stresses in the gallium nitride material layer reduces the tendency of cracks to form which enables the production of semiconductor materials including gallium nitride material layers having few or no cracks. The semiconductor materials may be used in a number of microelectronic and optical applications.

The invention has overcome the problem of growing gallium nitride materials having few or no cracks on silicon substrates which, due to the large differences in both thermal expansion rate and lattice constant between gallium nitride materials (e.g., GaN) and silicon, is considerably more challenging than on other types of substrates (e.g., SiC and sapphire).

In one aspect, the invention provides a semiconductor material. The material includes a silicon substrate and a compositionally-graded transition layer formed over the silicon substrate. The material further includes a gallium nitride material layer formed over the transition layer.

In another aspect, the invention provides a semiconductor material. The semiconductor material includes a silicon substrate and a gallium nitride material layer formed over the silicon substrate. The gallium nitride material layer has a crack level of less than 0.005 $\mu m/\mu m^2$.

In another aspect, the invention provides a semiconductor structure. The semiconductor structure includes a silicon substrate, and a gallium nitride material layer formed over the silicon substrate. The gallium nitride material layer has a thickness of greater than 0.5 micron. The semiconductor structure forms a semiconductor device.

In another aspect, the invention provides a method of producing a semiconductor material. The method includes the steps of forming a compositionally-graded transition layer over a silicon substrate, and forming a gallium nitride material layer over the transition layer.

In another aspect, the invention provides a method of producing a semiconductor material. The method includes forming a gallium nitride material layer formed over a silicon substrate. The gallium nitride material layer has a crack level of less than 0.005 $\mu m/\mu m^2$ In another aspect, the invention provides a method of forming a semiconductor structure. The method includes forming a semiconductor structure comprising a silicon substrate, and a gallium nitride material layer formed over the silicon substrate. The gallium nitride material layer has a thickness of greater than 0.5 micron.

In another aspect, the invention provides a semiconductor material. The semiconductor material comprises a silicon (100) substrate and a gallium nitride material layer having a Wurtzite structure formed over the silicon substrate.

Other advantages, aspects, and features of the invention will become apparent from the following detailed description of the invention when considered in conjunction with the accompanying drawings.

DETAILED DESCRIPTION OF THE INVENTION

The invention provides semiconductor materials including a gallium nitride material layer and a process to produce the semiconductor materials. As used herein, the phrase "gallium nitride material" refers to gallium nitride and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$) gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent).

Figure 1:
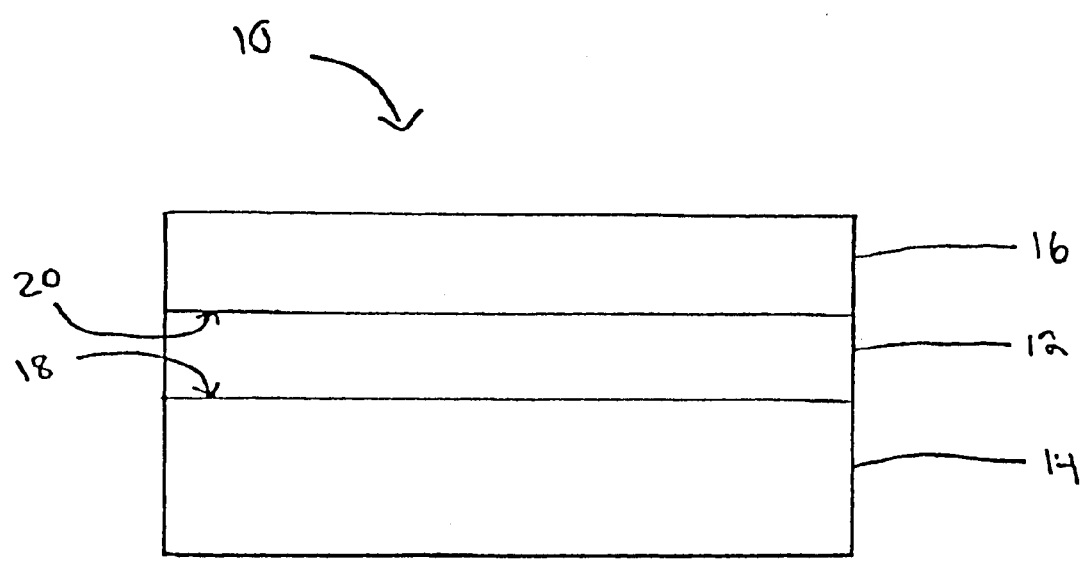
FIG. 1 illustrates a semiconductor material including a compositionally-graded transition layer according to one embodiment of the present invention.

Referring to FIG. 1, a semiconductor material 10 according to one embodiment of the invention is shown. Semiconductor material 10 includes a transition layer 12 formed over a silicon substrate 14 and a gallium nitride material layer 16 formed over the transition layer. As described further below, transition layer 12 is compositionally-graded to reduce internal stresses within gallium nitride material layer 16 that can result from differences between the thermal expansion rates of substrate 14 and the gallium nitride material layer. The internal stresses may arise, for example, when semiconductor material 10 is cooled after the deposition of gallium nitride material layer 16 and substrate 14 contracts more rapidly than the gallium nitride material layer. As a result of the reduced internal stresses, gallium nitride material layer 16 can be formed with a low crack level making semiconductor material 10 suitable for use in a number of applications including FETs, LEDs, laser diodes, and the like.

It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate.

As used herein, the term "compositionally-graded layer" refers to a layer having a composition that varies across at least a portion of the thickness of the layer. Thus, transition layer 12 includes at least two different compositions at different depths within the layer. As described further below, the composition of transition layer 12 can be varied in a number of ways. It is generally advantageous to vary the composition of transition layer 12 in a manner that provides sufficient strain relief to limit or prevent the formation of cracks in gallium nitride material layer 16.

According to one set of embodiments, transition layer 12 is composed of an alloy of gallium nitride such as $Al_xIn_yGa_{(1-x-y)}N$, $Al_xGa_{(1-x)}N$, and $In_yGa_{(1-y)}N$. It should be understood, however, that transition layers having other compositions may also be used. In embodiments which utilize alloys of gallium nitride, the concentration of at least one of the elements (e.g., Ga, Al, In) of the alloy is typically varied across at least a portion of the thickness of the transition layer. When transition layer 12 has an $Al_xIn_yGa_{(1-x-y)}N$ composition, x and/or y is varied. When transition layer 12 has a $Al_xGa_{(1-x)}N$ composition, x is varied. When transition layer 12 has a $In_yGa_{(1-y)}N$ composition, y is varied.

In certain preferred embodiments, it is desirable for transition layer 12 to have a low gallium concentration at back surface 18 and a high gallium concentration at front surface 20. It has been found that such transition layers are particularly effective in relieving internal stresses within gallium nitride material layer 16. Decreasing the gallium concentration of a gallium nitride alloy transition layer can make the thermal expansion rate of the alloy more similar to the thermal expansion rate of silicon. As described further below, gallium nitride material layer 16 typically includes a high gallium concentration. Thus, in these embodiments, increasing the concentration of gallium in transition layer 12 can make the thermal expansion rate of the alloy more similar to the thermal expansion rate of gallium nitride material layer 16. It is believed that in these preferred embodiments effective strain relief is achievable because back surface 18 has a relatively similar thermal expansion rate as substrate 14, while front surface 20 has a relatively similar thermal expansion rate as gallium nitride material layer 16.

In some cases, the sum of (x+y) at back surface 18 is greater than 0.4, greater than 0.6, greater than 0.8 or ever higher. In some preferred embodiments, (x+y)=1 at back surface 18, so that transition layer 12 is free of gallium at the back surface. In some cases, the sum of (x+y) is less than 0.3, less than 0.2, or even less at front surface 20. In some preferred embodiments, the sum of (x+y)=0 at front surface 20, so that transition layer 12 has a composition of GaN at the front surface. It may be particularly preferred for transition layer 12 to have a composition of GaN at front surface 20, when gallium nitride material layer 16 has a composition of GaN. In other cases when gallium nitride material layer is composed of an alloy of GaN, it may be preferable for the composition of transition layer 12 at front surface 20 to be the same as the composition of gallium nitride material layer 16. In some cases, transition layer 12 is free of gallium at back surface 18 and has a composition of GaN at front surface 20.

In certain embodiments, it may be preferable for transition layer 12 to comprise $Al_xGa_{(1-x)}N$. In these cases, the transition layer is free of indium. In other cases, transition layer 12 may include a small amount of indium, for example, less than 10 percent by weight. When indium is present in transition layer 12 (i.e., $Al_xIn_yGa_{(1-x-y)}N$) the concentration of indium (i.e., y) may remain constant throughout the transition layer, while the concentration of gallium and aluminum are graded.

The composition in transition layer 12 may be graded across its thickness in a number of different manners. For example, the composition may be graded continuously, discontinuously, across the entire thickness, or across only a portion of the thickness. As described above, the composition may be graded by varying the concentration of one or more of the elements (i.e., Ga, Al, In). FIGS. 2A to 2I illustrate exemplary manners in which the composition may be graded by varying the concentration of one of the elements as a function of thickness across transition layer 12. In certain preferred embodiments, the profiles represent the concentration of gallium across the thickness of transition layer 12, though it should be understood that in other embodiments the profiles may represent the concentration of other elements (i.e., Al or In). The convention in FIGS. 2A to 2I is that the thickness of transition layer 12 increases in the direction away from substrate 14 (i.e., t=0 at back surface 18 and t=1 at front surface 20).

Figure 2A:
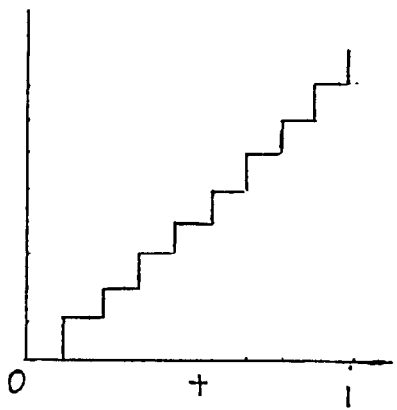
FIGS. 2A to 2I are exemplary profiles of the concentration of an element as a function of the thickness across the compositionally-graded transition layer.
Figure 2B:
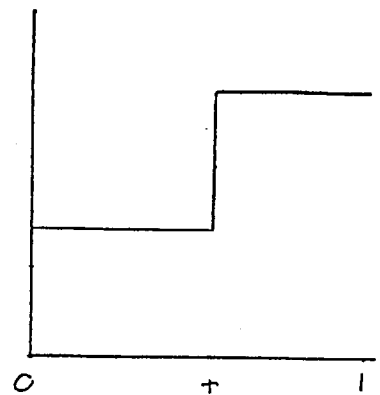
Figure 2C:
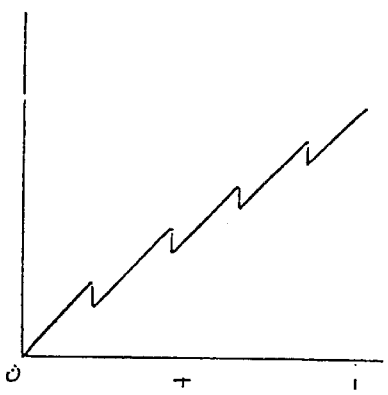
Figure 2D:
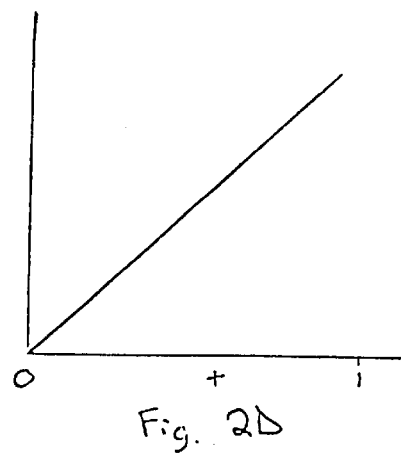
Figure 2E:
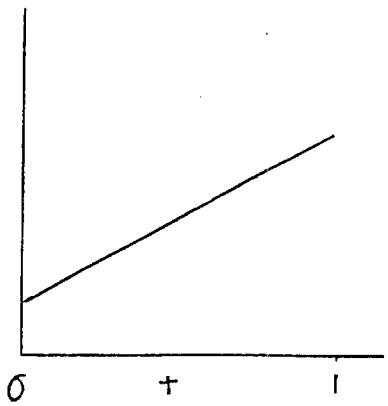
Figure 2F:
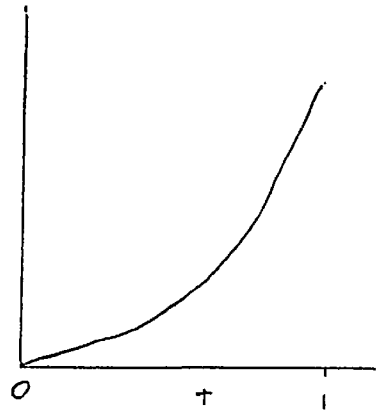
Figure 2G:
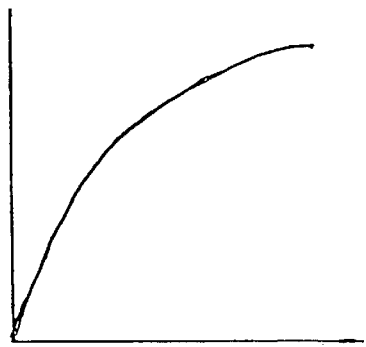
Figure 2H:
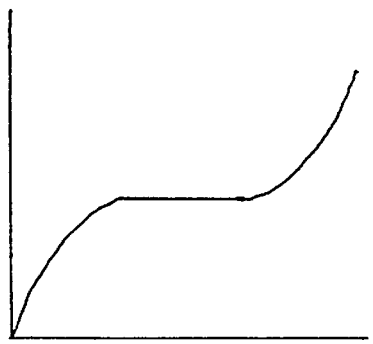
Figure 2I:
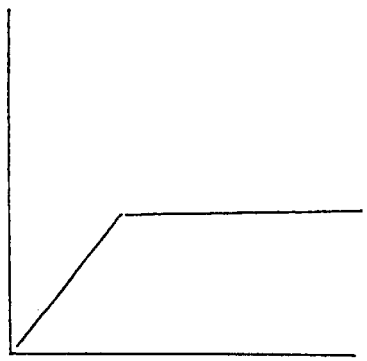

FIG. 2A shows a step-wise variation of concentration as a function of thickness which includes multiple steps. FIG. 2B shows a step-wise variation of concentration as a function of thickness which includes two steps. FIG. 2C shows a saw tooth variation of concentration as a function of thickness. FIG. 2D shows continuous variations of concentration at a constant rate as a function of thickness. FIG. 2E shows a continuous variation of concentration at a constant rate starting from a non-zero concentration. FIGS. 2F and 2G show continuous variations of concentration as a function of thickness at exponential rates. FIG. 2H shows a discontinuous variation of concentration as a function of thickness. FIG. 2I shows a variation of the concentration across a portion of the thickness of the transition layer.

It should be understood that the profiles illustrated in FIGS. 2A to 2I are intended to be exemplary and that the composition of transition layer 12 may be graded in other manners that are within the scope of the present invention.

Figure 3A:
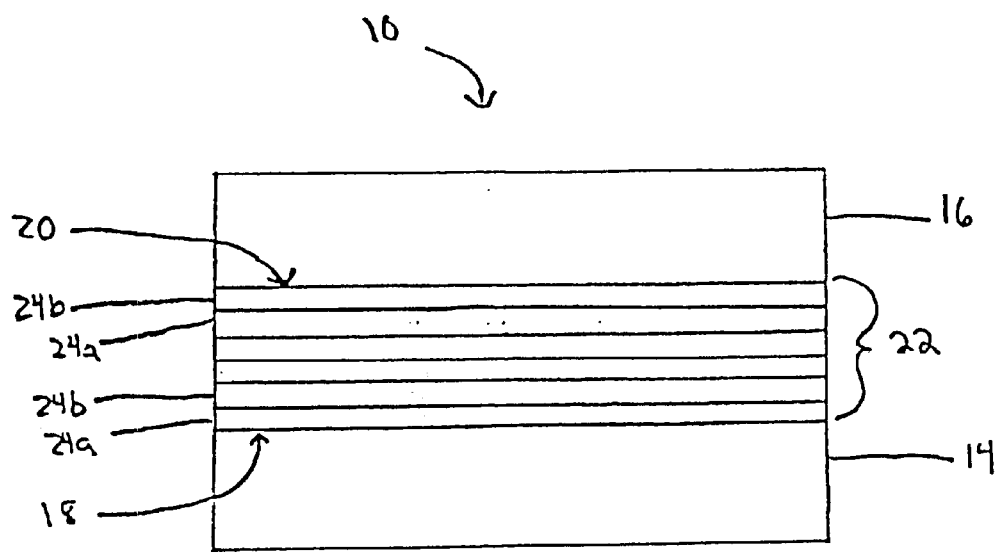
FIGS. 3A and 3B illustrate a semiconductor material that includes a superlattice transition layer according to another embodiment of the present invention.
Figure 3B:
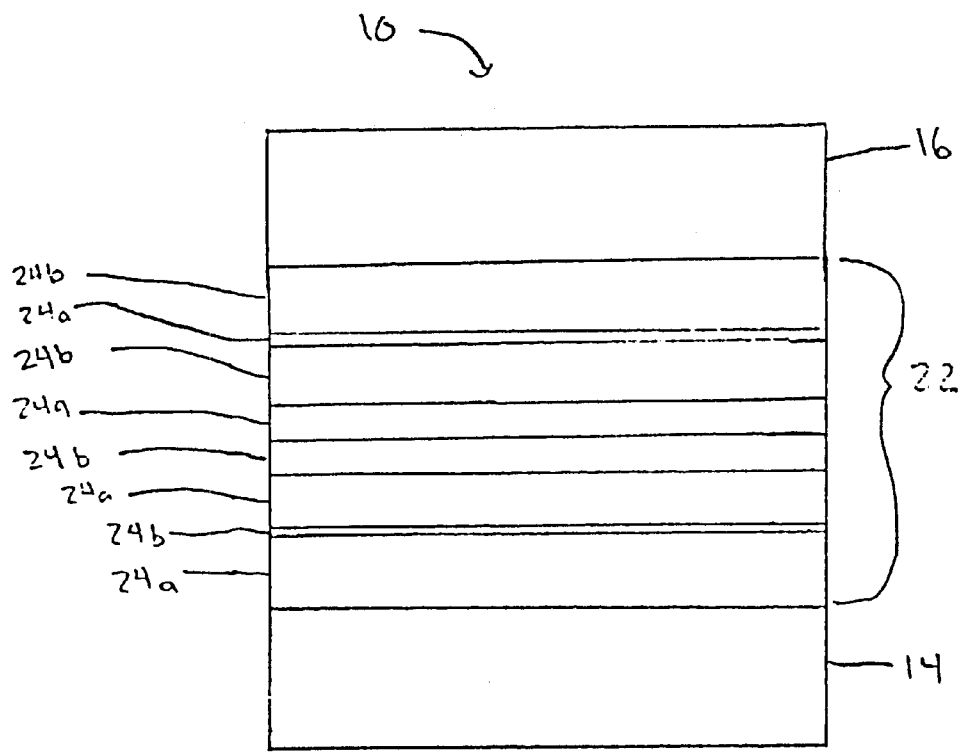
Figure 4A:
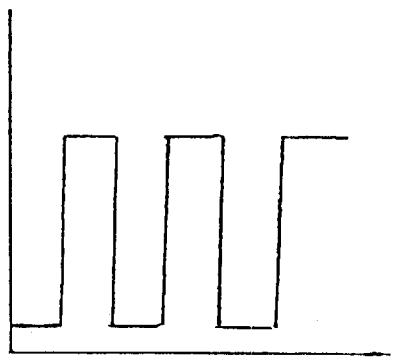
FIGS. 4A and 4B are exemplary profiles of the concentration of an element as a function of the thickness of the transition layers in the semiconductor materials of FIGS. 3A and 3B, respectively.

Referring to FIGS. 3A and 3B, transition layer 12 may be a compositionally-graded strained layer superlattice 22 according to another embodiment of the present invention. Superlattice 22 includes alternating layers 24a, 24b of semiconductor compounds having different compositions. In some cases, the composition across each individual layer 24a, 24b is varied according to any of the manners described above. In other cases, the composition of individual layers 24a, 24b is constant across the thickness of the individual layer as shown in the concentration profile of FIGS. 4A and 4B. As shown in FIGS. 3B (and 4B), the thicknesses of individual layers 24a, 24b is varied across transition layer 12 to provide compositional grading.

In one preferred set of embodiments, superlattice 22 comprises alternating layers of gallium nitride alloys having different compositions. For example, layer 24a has a composition of $Al_xIn_yGa_{(1-x-y)}N$ and layer 24b has a composition of $Al_aIn_bGa_{(1-a-b)}N$, wherein x≠a and y≠b. In cases when the composition is graded across each individual layer, the concentration of at least one of the elements (i.e., Al, In, Ga) of the alloy can be varied according to any of the manners described above. In cases when the composition of individual layers 24a, 24b is constant (FIG. 3B), the gallium concentration is typically different in individual layers 24a, 24b.

Figure 4B:
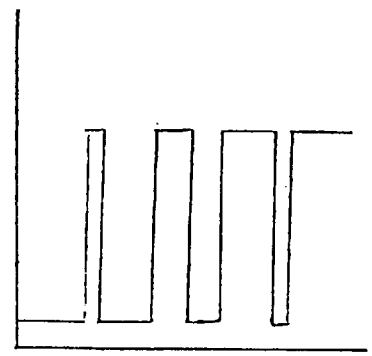

As described above, it may be desirable to have a low gallium concentration at back surface 18 and a high gallium concentration at front surface 20. In embodiments that utilize superlattice 22 as transition layer 12, increasing the gallium concentration in a direction away from back surface 18 can be accomplished by varying the thickness of individual layers. As shown in FIGS. 3B and 4B, layer 24a has a low gallium concentration and layer 24b has a high gallium concentration. As shown, layers 24a are relatively thick and layers 24b are relatively thin proximate back surface 18. The thickness of layers 24a is decreased and the thickness of layers 24b is increased in a direction away from back surface 18. Thus, layers 24a are relatively thin and layers 24b are relatively thick proximate front surface 20. This structure provides a low gallium concentration at back surface 18 and a high gallium concentration at front surface 20.

It should be understood that transition layer 12 may be formed of a combination of a single layer having a graded composition and a superlattice. In some cases, the superlattice is formed over the single compositionally-graded layer. In other cases, the single compositionally-graded layer is formed over the superlattice.

Transition layer 12 can have a variety of thicknesses depending on the application. Generally, though not always, transition layer 12 has a thickness of less than about 500 microns. In some cases, relatively thick transition layers are preferable, for example between about 2.0 microns and about 20 microns. Thick transition layers may be preferred when thick gallium nitride material layers (i.e., greater than 5 microns) are produced. In some cases, relatively thin transition layers are preferable, for example between about 0.03 micron and about 2.0 microns. When superlattice structures are used as transition layers, the thickness of individual layers 24a, 24b depends upon the particular application. Typically the thickness of individual layers 24a, 24b may be between about 0.001 microns and about 0.020 microns. As described above, the thicknesses of individual layers may vary across transition layer 12 (FIG. 3B).

Gallium nitride material layer 16 is formed of gallium nitride (GaN) or any of its alloys including aluminum gallium nitride $(Al_xGa_{(1-x)}N)$, indium gallium nitride $(In_yGa_{(1-y)}N)$, and aluminum indium gallium nitride $(Al_xIn_yGa_{(1-x-y)}N)$. The composition of gallium nitride material layer 16 is generally constant across its thickness as distinguished with transition layer 12. Thus, x and/or y are generally fixed when gallium nitride material is formed of any of the aforementioned compound alloys. It should be understood that small variations in the composition of gallium nitride material layer 16 may occur, for example, as a result of slight non-uniformities and inhomogeneities during growth.

In certain preferred embodiments, gallium nitride material layer 16 has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for gallium nitride material layer 16 to have a composition of GaN (i.e., x+y=0).

As described above, gallium nitride material layer 16 has a low crack level as a result of the ability of transition layer 12 to relieve stress arising from differences in thermal expansion rates between the silicon substrate and the gallium nitride material. A "crack," as used herein, is a linear fracture or a cleavage having a length to width ratio of greater than 5:1 that extends to the surface of the gallium nitride material. It should be understood that a crack may or may not extend through the entire thickness of the gallium nitride material. "Crack level" is defined as a total measure of all crack lengths in a gallium nitride material per unit surface area. Crack level can be expressed in units of $\mu m/\mu m^2$. The crack level of a gallium nitride material can be measured, for example, using optical microscopy techniques. To determine the crack level, the length of all of the cracks in a given area (i.e., 1 mm×1 mm) are added together and divided by the total surface area. If necessary, this process may be repeated at a number of locations across the surface to provide a measurement representative of the entire gallium nitride material. The crack level at each location may be averaged to provide a crack level for the material. The number of locations depends upon the amount of surface area of the gallium nitride material. When measuring the crack level of a gallium nitride material, measurements are not made within a region proximate to edges of the material known as an edge exclusion. The nominal edge exclusion is 5 mm from the edge. Edge effects in such regions may lead to increased crack levels and are typically not used to in device formation.

Gallium nitride material layer 16 advantageously has a low crack level. In some cases, gallium nitride material layer 16 has a crack level of less than 0.005 $\mu m/\mu m^2$. In some cases, gallium nitride material has a very low crack level of less than 0.001 $\mu m/\mu m^2$. In certain cases, it may be preferable for gallium nitride material layer 16 to be substantially crack-free as defined by a crack level of less than 0.0001 $\mu m/\mu m^2$.

Gallium nitride material layer 16 preferably has a monocrystalline structure. In preferred cases, gallium nitride material layer 16 has a Wurtzite (hexagonal) structure. Preferably, the entire gallium nitride material layer has a Wurtzite structure. The gallium nitride material layer 16 is generally of high enough quality so as to permit the formation of devices therein. In some embodiments, gallium nitride material layer 16 has a relatively low amount of defects (e.g., less than $10^9$ cm$^{-2}$) which, for example, result from the lattice mismatch between gallium nitride and silicon.

The thickness of gallium nitride material layer 16 is dictated, in part, by the requirements of the specific application. In applications when gallium nitride material is used as a device layer, the thickness is sufficient to permit formation of the device. Gallium nitride material layer 16 generally has a thickness of greater than 0.1 micron, though not always. In other cases, thicker gallium nitride material layers are desired such as thicknesses greater than 0.5 micron, greater than 0.75 micron, greater than 1.0 microns, greater than 2.0 microns, or even greater than 5.0 microns. Even thick gallium nitride material layers 16 are achievable at low crack densities because of the presence of transition layer 12. In relatively thick gallium nitride layers, upper regions of the layer may include low amounts of defects due to the tendency of defects to annihilate one another as they propagate vertically through the layer. Thus, in these cases, the use of thick gallium nitride layers may improve device performance.

Silicon substrate 14 typically is formed of high-quality single-crystal silicon as readily available in the art. Silicon substrates 14 having different crystallographic orientations may be used. In some cases, silicon (111) substrates are preferred. In other cases, silicon (100) substrates are preferred. Gallium nitride material layer 16 having a Wurtzite structure may be grown on silicon (111) substrates and silicon (100) substrates using transition layer 12. It is particularly surprising that gallium nitride material layer 16 having a Wurtzite structure may grown on silicon (100) substrates because conventional techniques generally result in gallium nitride materials having a mixture of zinc blend (cubic) and Wurtzite structures when grown on silicon (100) substrates.

Silicon substrate may have any dimensions as used in the art. Suitable diameters include, but are not limited to, 2 inches, 4 inches, 6 inches, and 8 inches. In some embodiments, silicon substrate 14 is relatively thick, for example, greater than 250 microns. Thicker substrates are generally able to resist bending which can occur, in some cases, in thinner substrates.

As used herein, silicon substrate 14 refers to any substrate that includes a silicon layer at its top surface. Examples of suitable silicon substrates include substrates that are composed entirely of silicon (e.g., silicon wafers), silicon-on-insulator (SOI) substrates, silicon-on-sapphire substrate (SOS), SIMOX substrates, amongst others.

Figure 5:
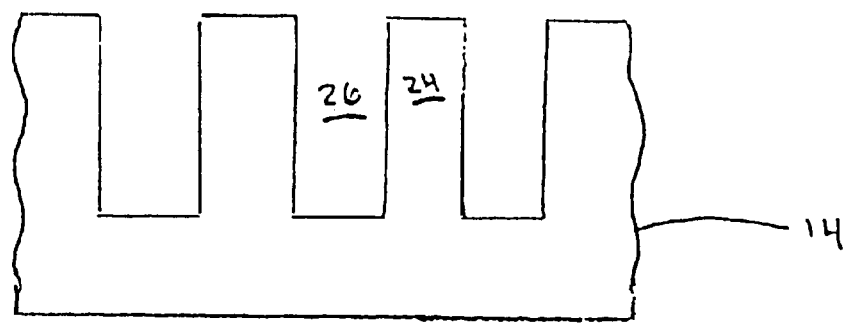
FIG. 5 illustrates a textured substrate used to form the semiconductor material according to one embodiment of the present invention.

Referring to FIG. 5, silicon substrate 14 is textured according to some embodiments of the present invention. As illustrated, textured substrate 14 includes a plurality of posts 24 which define trenches 26 therebetween. Such texturing can be provided using selective etching and/or selective epitaxial growth. Etching may be performed using standard dry or wet etching techniques, such as with a mask which later may be removed. In some cases, textured substrates are used in conjunction with the transition layers described herein to grow gallium nitride material layers with very low defect densities (e.g., less than $10^7$ cm$^{-2}$). Silicon substrate 14 may also be pre-patterned to include mask areas which selectively expose regions of the substrate, while covering other regions. Such pre-patterned substrates enable selective area epitaxial growth which may be advantageous in minimizing defect densities.

Figure 6:
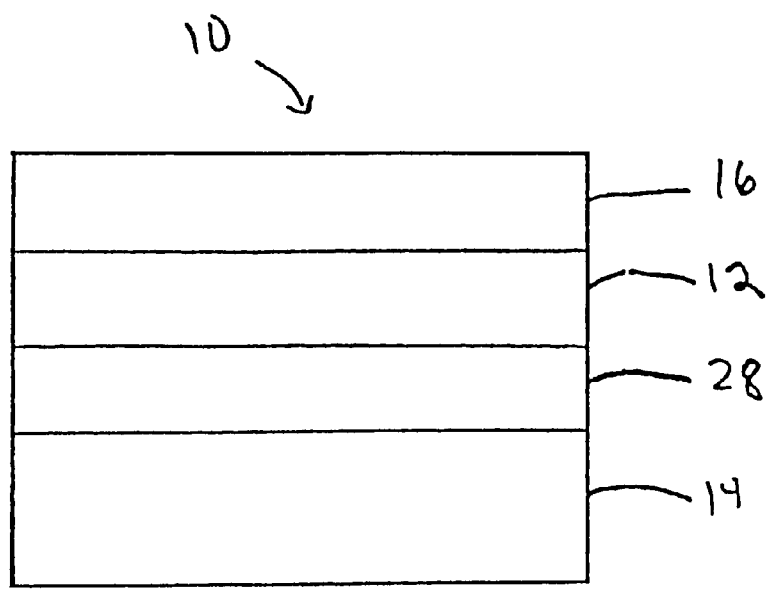
FIG. 6 illustrates a semiconductor material including an intermediate layer between the substrate and the transition layer according to another embodiment of the present invention.

Referring to FIG. 6, semiconductor material 10 includes an intermediate layer 28 between silicon substrate 14 and transition layer 12 according to another embodiment of the present invention. It should be understood that intermediate layer 28 may also be positioned between transition layer 12 and gallium nitride material layer 16. Intermediate layer 28, when provided, may further relieve stress in gallium nitride material layer 16. Intermediate layer generally has a thickness of less than about 500 microns and, in some cases, between about 0.01 micron and about 2.0 microns. The presence of intermediate layer 28 may permit reduction of the thickness of transition layer 12. The composition of the intermediate layer is generally constant throughout its thickness.

Intermediate layer 28, for example, can be composed of a GaN alloy such as aluminum gallium nitride ($Al_xGa_{(1-x)}N$), indium gallium nitride ($In_yGa_{(1-x-y)}N$), and aluminum indium gallium nitride ($Al_xIn_yGa_{(1-x-y)}N$). In these cases, the sum of (x+y) in the intermediate layer may be greater than 0.4, greater than 0.6, greater than 0.8, greater than 0.9, or even more. In some preferred cases, the intermediate layer is free of gallium and is composed of $Al_xIn_yN$ or AlN. GaN alloy intermediate layers with low Ga concentrations may be effective at relieving stresses because they have a thermal expansion rate relatively close to the thermal expansion rate of silicon substrate 14.

It should be understood that intermediate layer 28 may be utilized in accordance with any of the embodiments described herein including embodiments that use a super-lattice as a transition layer. In embodiments in which transition layer 12 includes a single compositionally-graded layer and a superlattice, the intermediate layer may be positioned between the compositionally-graded layer and the superlattice. In some embodiments of the invention, more than one intermediate layer 28 having different compositions may be provided.

According to one preferred method, transition layer 12 and gallium nitride material layer 16 are grown using a metalorganic chemical vapor deposition (MOCVD) process. It should be understood that other suitable techniques known in the art may also be utilized to deposit transition layer 12 and gallium nitride material layer 16 including molecular beam epitaxy (MBE), hydride vapor phase epitaxy (HVPE), and the like.

Generally, the MOCVD process involves introducing different source gases into an environment (e.g., a process system) around a substrate and providing conditions which promote a reaction between the gases to form a layer on the substrate surface. The reaction proceeds until a layer of desired thickness is achieved. The composition of the layer may be controlled, as described further below, by several factors including gas composition, gas concentration, and the reaction conditions (e.g. temperature and pressure).

Examples of suitable source gases for MOCVD growth of the transition layer include trimethylaluminum (TMA) or triethylaluminum (TEA) as sources of aluminum; trimethylindium (TMI) or triethylindium (TEI) as sources of indium; trimethylgallium (TMG) or trimethylgallium (TEG) as sources of gallium; and ammonia ($NH_3$) as a source of nitrogen. The particular source gas used depends upon the desired composition of the transition layer. For example, an aluminum source (e.g., TMA or TEA), a gallium source (TMG or TEG), and a nitrogen source are used to deposit films having an $Al_xGa_{1-x}N$ composition.

The flow rates of the source gases, the ratios of the source gases, and the absolute concentrations of the source gases may be controlled to provide transition layers having the desired composition. For the growth of $Al_xGa_{1-x}N$ layers, typical TMA flow rates are between about 5 μmol/min and about 50 μmol/min with a flow rate of about 20 μmol/min being preferred in some cases; typical TMG flow rates are between about 5 μmol/min and 250 μmol/min, with a flow rate of 115 μmol/min being preferred in some cases; and the flow rate of ammonia is typically between about 3 slpm to about 10 slpm. The reaction temperatures are generally between about 900° C. and about 1200° C. and the process pressures are between about 1 Torr and about 760 Torr. It is to be understood that the process conditions, and in particular the flow rate, are highly dependent on the process system configuration. Typically, smaller throughput systems require less flow than larger throughput systems.

Process parameters are suitably adjusted to control the compositional grading of the transition layer. The composition may be graded by changing the process conditions to favor the growth of particular compositions. For example, to increase incorporation of gallium in the transition layer thereby increasing the gallium concentration, the flow rate and/or the concentration of the gallium source (e.g., TMG or TEG) may be increased. Similarly, to increase incorporation of aluminum into the transition layer thereby increasing the aluminum concentration, the flow rate and/or the concentration of the aluminum source (e.g., TMA or TEA) may be increased. The manner in which the flow rate and/or the concentration of the source is increased (or decreased) controls the manner in which the composition is graded. In other embodiments, the temperature and/or pressure is adjusted to favor the growth of a particular compound. Growth temperatures and pressures favoring the incorporation of gallium into the transition layer differ from the growth temperatures and pressures favoring the incorporation of aluminum into the transition layer. Thus, the composition may be graded by suitably adjusting temperature and pressure.

Typical growth rates of the transition layer are between about 0.01 μm/hr and about 3.0 μm/hr. The growth rate depends upon the process parameters as well as the composition of the layer.

The gallium nitride material layer (and intermediate layers, if present) may also be grown using an MOCVD process. The process may utilize source gases and process parameters similar to those described above for the deposition of the transition layer. The particular source gases and process parameters are selected based upon the desired composition. When depositing the gallium nitride material layer (or the intermediate layer), however, the process parameters are maintained constant so as to provide a film having a constant composition.

The semiconductor materials of the invention may be used in a variety of applications. In some cases, semiconductor material 10 is processed using known techniques to form a semiconductor device. Doped regions may be formed within gallium nitride material layer 16 and additional layers may be deposited upon the gallium nitride material layer to produce the desired semiconductor structure. In some embodiments, gallium nitride material layer 16 is doped using known techniques to achieve a desired conductivity.

Any suitable semiconductor device known in the art including electronic and optical devices can be produced using semiconductor material 10. Exemplary devices include LEDs, laser diodes, FETs (e.g., HFETs) amongst others.

Figure 7:
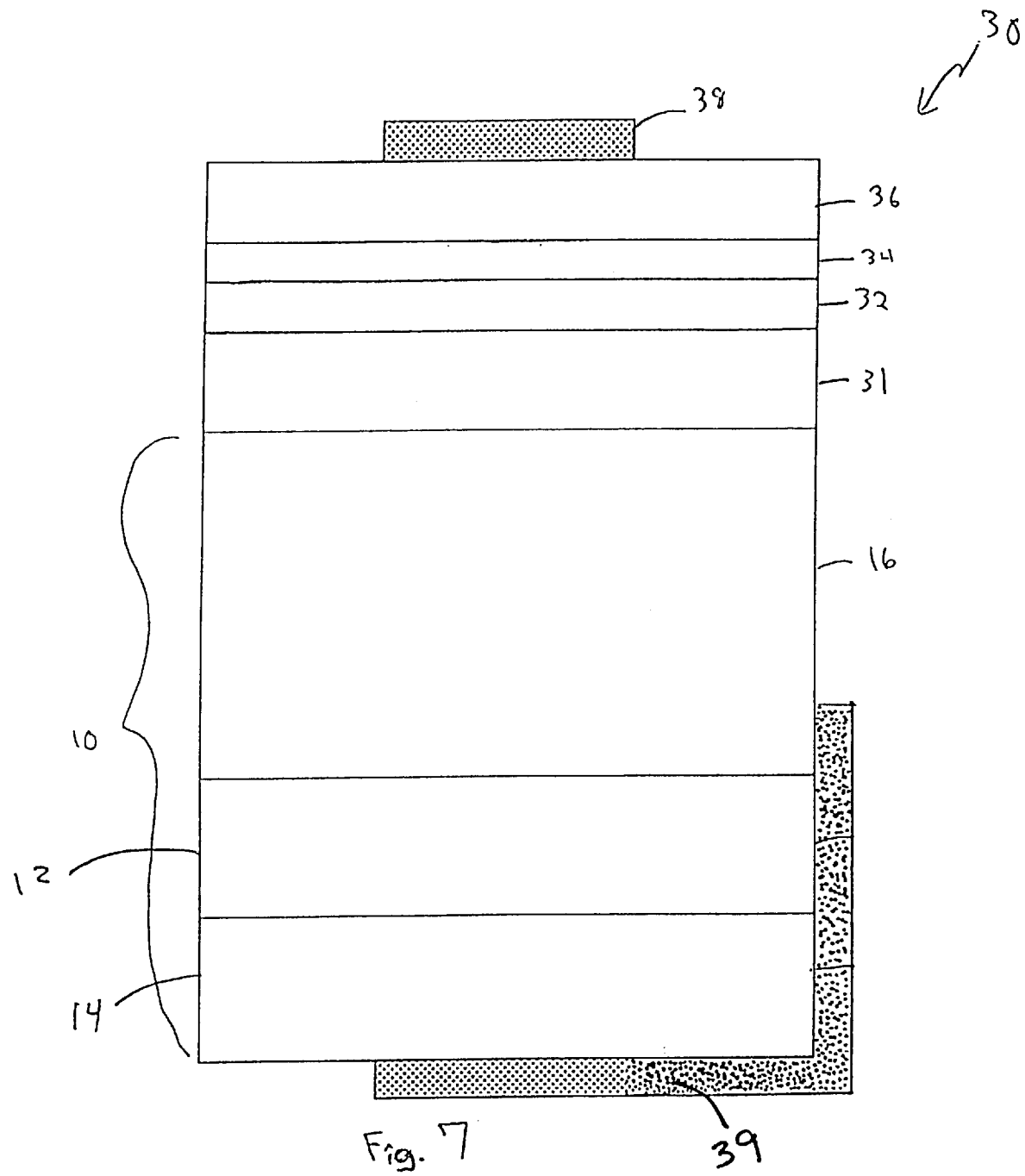
FIG. 7 illustrates an LED formed from the semiconductor material according to another embodiment of the present invention.

FIG. 7 schematically illustrates an exemplary LED 30 formed from semiconductor material 10. LED 30 includes silicon-doped gallium nitride material layer 16 formed on transition layer 12 on silicon substrate 14. In the illustrative embodiment, the following layers are formed on gallium nitride material layer 16 in succession: a silicon-doped $Al_xGa_{(1-x)}N$ layer 31 (containing 0–20% by weight Al), a GaN/InGaN single or multiple quantum well 32, a magnesium-doped $Al_xGa_{(1-x)}N$ layer 34 (containing 10–20% by weight Al), and a magnesium-doped GaN layer 36. LED 30 includes a p-type metal contact 38 on magnesium-doped GaN layer 36 and an n-type metal contact pad 39 on silicon-doped gallium nitride material layer 16. LED 30 may be provided as a variety of different structure including: a double heterostructure (e.g., Al>0% in layer 31), a single heterostructure (e.g., Al=0% in layer 31), a symmetric structure, or an asymmetric structure. It should be understood that LED may have a variety of different structures as known to those of ordinary skill in the art.

Figure 8:
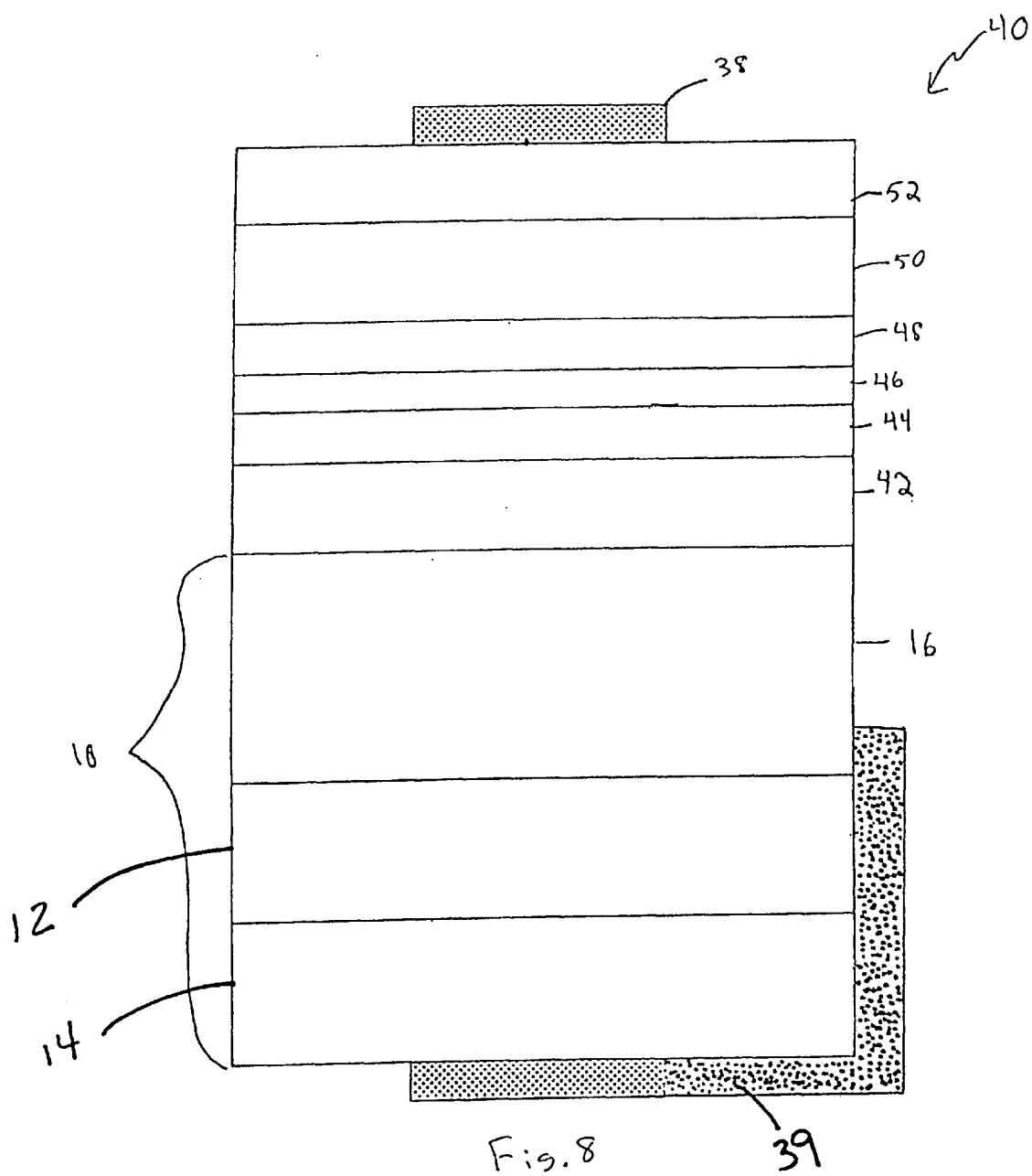
FIG. 8 illustrates a laser diode formed from the semiconductor material according to another embodiment of the present invention.

FIG. 8 schematically illustrates an exemplary laser diode 40 formed from semiconductor material 10. Laser diode 40 includes silicon-doped gallium nitride material layer 16 formed on transition layer 12 on silicon substrate 14. In the illustrative embodiment, the following layers are formed on gallium nitride material layer 16 in succession: a silicon-doped $Al_xGa_{(1-x)}N$ layer 42 (containing 5–30% by weight Al), a silicon-doped $Al_xGa_{(1-x)}N$ layer 44 (containing 0–20% by weight Al), a GaN/InGaN single or multiple quantum well 46, a magnesium-doped $Al_xGa_{(1-x)}N$ layer 48 (containing 5–20% by weight Al), a magnesium-doped $Al_xGa_{(1-x)}N$ layer 50 (containing 5–30% by weight Al), and a magnesium-doped GaN layer 52. Laser diode 40 includes a p-type metal contact 38 on magnesium-doped GaN layer 52 and an n-type metal contact pad 39 on silicon-doped gallium nitride material layer 16. It should be understood that laser diode 40 may have a variety of different structures as known to those of ordinary skill in the art.

Figure 9:
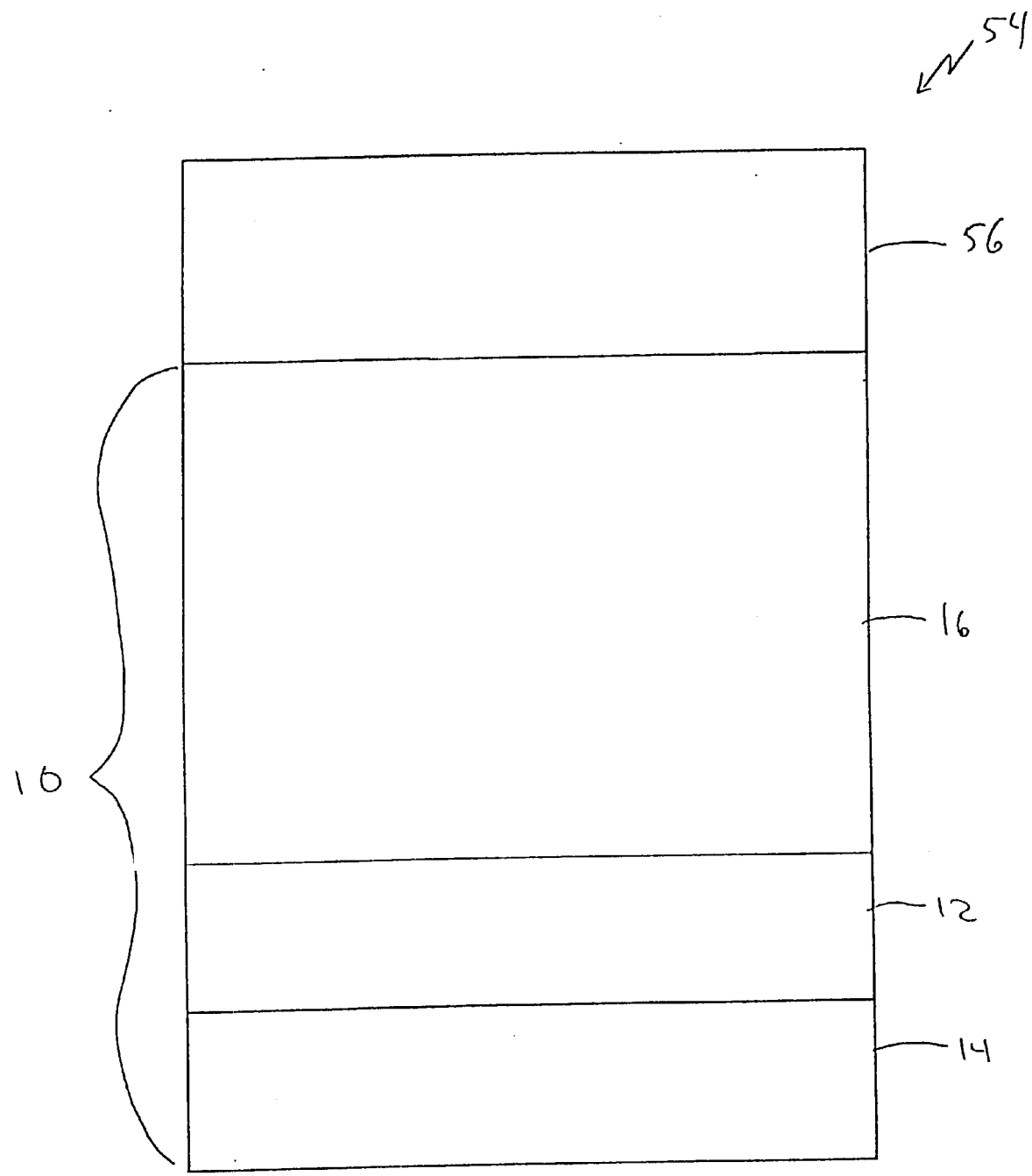
FIG. 9 illustrates a FET formed from the semiconductor material according to another embodiment of the present invention.

FIG. 9 schematically illustrates a FET 54 (e.g., HFET) formed from semiconductor material 10. FET 54 includes intrinsic gallium nitride material layer 16 formed on transition layer 12 on silicon substrate 14. FET 54 includes an Al$_x$Ga$_{(1-x)}$N layer 56 (containing 10–40% by weight Al). It should be understood that FET 54 may have a variety of different structures as known to those of ordinary skill in the art.

The function and advantage of these and other embodiments of the present invention will be more fully understood from the examples below. The following examples are intended to illustrate the benefits of the present invention, but do not exemplify the full scope of the invention.

EXAMPLE 1

Production of Gallium Nitride Layer Using a Compositionally Graded Transition Layer This example illustrates the effectiveness of a compositionally-graded transition layer in limiting the number of cracks in a gallium nitride material grown on a silicon substrate.

An MOCVD process was used to grow an AlN intermediate layer, an Al$_x$Ga$_{1-x}$N compositionally-graded transition layer, and a GaN layer in succession on a silicon substrate.

A silicon substrate having a 2-inch diameter and a thickness of 250 microns was positioned in an MOCVD system. To grow the AlN intermediate layer, trimethylaluminum gas (TMA) was introduced into the MOCVD system at a flow rate of about 50 μmol/min and ammonia gas (NH$_3$) was introduced into the system at a flow rate of between about 3 and about 10 slpm. A growth temperature of between about 1000–1100° C. and a growth pressure 30–200 Torr were maintained in the system. After about 60 minutes, an AlN intermediate layer was formed having a thickness of about 0.3 micron on the silicon substrate.

After the growth of the intermediate layer, trimethylgallium (TMG) was introduced into the system at a flow rate of about 5 μmol/min to provide a ratio of TMA:TMG of about 10:1. To form the compositionally-graded transition layer, the flow rate of the TMA was decreased to about 5 μmol/min, while the flow rate of TMG was increased to about 115 μmol/min. Over this time, the ratio of TMA:TMG was decreased from about 10:1 to about 1:23. After about 30 minutes, a compositionally-graded transition layer having a thickness of about 0.4 micron was grown on the intermediate layer.

To grow the gallium nitride layer on the transition layer, the introduction of TMA into the system was stopped and the TMG flow rate was adjusted to about 115 μmol/min. The flow rate of ammonia was maintained between about 3 and about 10 slpm. The growth temperature was maintained between about 1000 and about 1050° C. and the growth pressure between about 30 and about 200 Torr. After about 45 minutes, a GaN layer having a thickness of about 1.5 micron was grown on the compositionally-graded transition layer. The semiconductor material was furnace-cooled to room temperature and removed from the MOCVD system for analysis.

The resulting semiconductor material included a 0.3 micron AlN intermediate layer formed on the silicon substrate; a 0.4 micron thick continuously graded Al$_x$Ga$_{1-x}$N transition layer formed on the intermediate layer; and a 1.5 micron GaN layer grown on the transition layer. The composition of the Al$_x$Ga$_{1-x}$N transition layer was graded from x=0.8 at the juncture with the intermediate layer to x=0 at the juncture with the GaN layer. The GaN layer had a monocrystalline structure.

Figure 10:
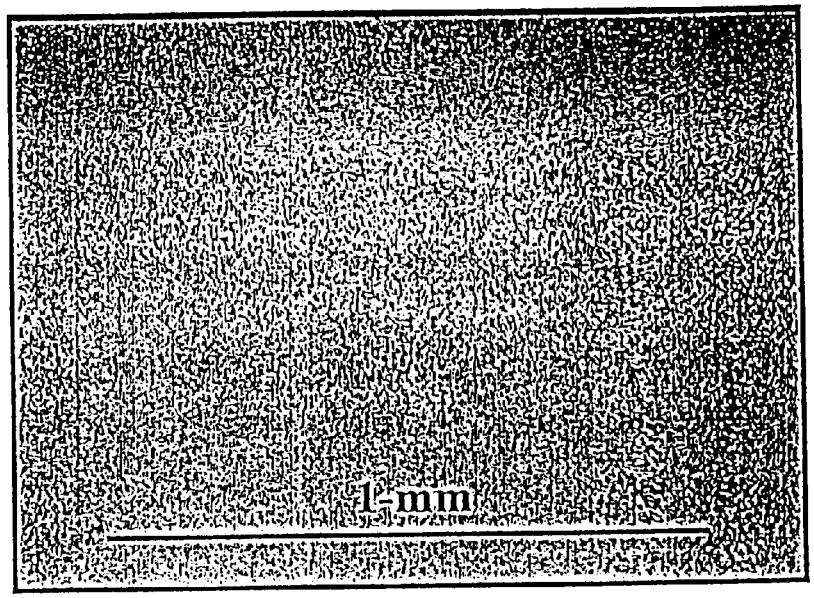
FIG. 10 is a micrograph of the surface of a gallium nitride layer formed on a silicon substrate with a transition layer as described in Example 1.

The crack level of the semiconductor material was measured using an optical microscopic technique. The microscope was equipped with the camera capable of taking micrographs of the surface of the GaN layer. FIG. 10 is a micrograph showing a representative area of slightly greater than 1 mm$^2$ on the surface of the GaN layer. No cracks are visible in the representative area. Measurements were repeated at several other locations on the surface of the GaN layer and similar results were achieved. The gallium nitride material was found to be substantially crack-free as defined by a crack level of less than 0.0001 μm/μm$^2$.

This example illustrates the ability to grow gallium nitride layers having a low crack level on a silicon substrate using a compositionally-graded transition layer.

COMPARATIVE EXAMPLE 2

Production of Gallium Nitride Layer Without Using a Compositionally Graded Transition Layer This example illustrates the generation of cracks in a gallium nitride material grown on a silicon substrate without using a compositionally-graded transition layer.

An MOCVD process was used to grow an AlN intermediate layer and a GaN layer in succession on a silicon substrate.

A silicon (111) substrate having a 2-inch diameter and a thickness of 250 microns was positioned in the same MOCVD system as used in Example 1. An AlN intermediate layer was formed using essentially the same processing conditions as the growth of the intermediate layer in Example 1. A GaN layer was grown on the intermediate layer using essentially the same processing conditions as the growth of the GaN layer in Example 1. A compositionally-graded transition layer was not grown. The semiconductor material was furnace-cooled to room temperature and removed from the MOCVD system for analysis.

The resulting semiconductor material included a 0.3 micron AlN intermediate layer formed on the silicon substrate, and a 1.5 micron GaN layer grown on the intermediate layer. The GaN layer had a monocrystalline structure.

Figure 11:
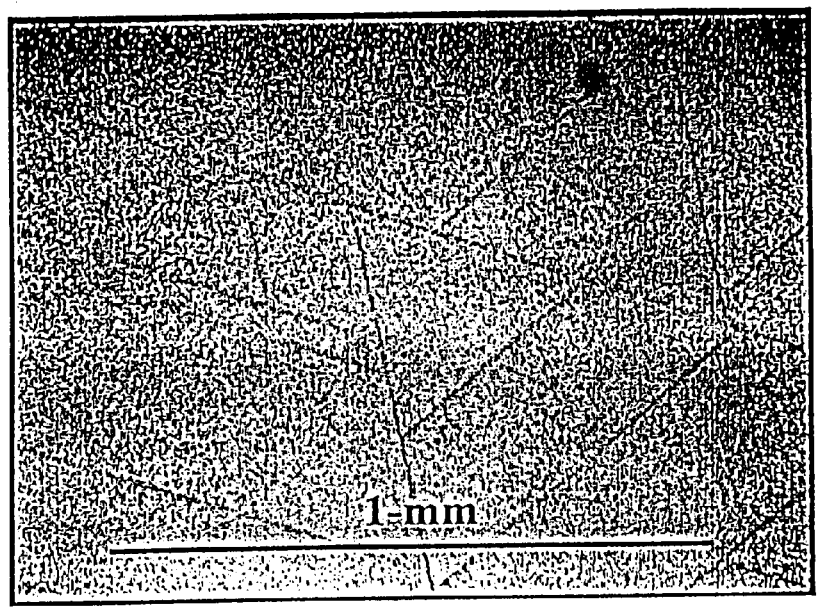
FIG. 11 is a micrograph of the surface of a gallium nitride layer formed on a silicon substrate without a transition layer as described in comparative Example 2.
Figure 2A:
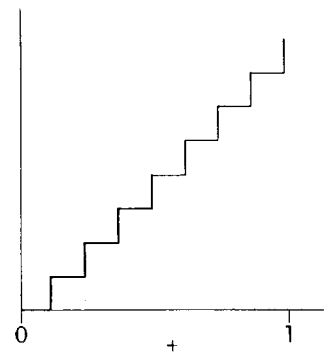
Figure 2B:
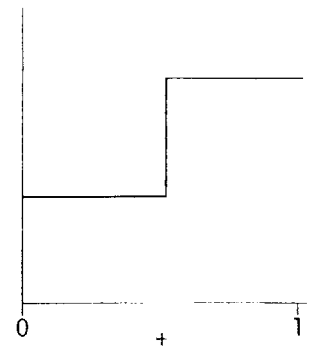
Figure 2C:
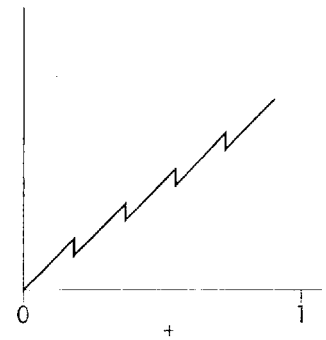
Figure 2D:
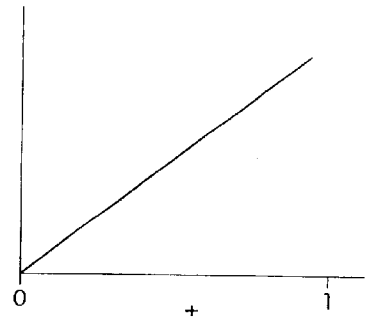
Figure 2E:
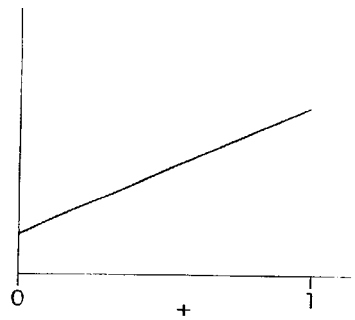
Figure 2F:
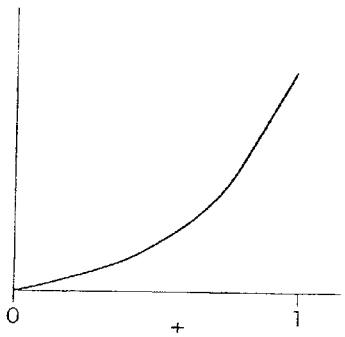

The crack level of the GaN layer was measured using the same technique as described in Example 1. FIG. 11 is a micrograph showing a representative area of slightly greater than 1 mm$^2$ on the surface of the GaN layer. The length of each crack in the area was measured and added together to determine the total crack length. The total crack length was divided by the surface area to determine the crack level. Measurements were repeated at several other locations on the surface which were averaged to provide a crack level of the GaN layer of about 0.007 μm/μm$^2$.

This comparative example illustrates the presence of cracks in gallium nitride layers grown on a silicon substrate without using a compositionally-graded transition layer.

Those skilled in the art would readily appreciate that all parameters listed herein are meant to be exemplary and that the actual parameters would depend upon the specific application for which the semiconductor materials and methods of the invention are used. It is, therefore, to be understood that the foregoing embodiments are presented by way of example only and that, within the scope of the appended claims and equivalents thereto the invention may be practiced otherwise than as specifically described.

What is claimed is:

1. A semiconductor material comprising:
   a silicon substrate;
   an intermediate layer comprising aluminum nitride, an aluminum nitride alloy, or a gallium nitride alloy formed directly on the substrate;

a compositionally-graded transition layer formed over the intermediate layer; and a gallium nitride material layer formed over the transition layer, wherein the semiconductor material forms a PET.

2. The semiconductor material of claim 1, wherein the composition of the transition layer is graded discontinuously across the thickness of the layer.

3. The semiconductor material of claim 1, wherein the transition layer comprises an alloy of gallium nitride selected from the group consisting of $Al_xIn_yGa_{(1-x-y)}N$, $In_yGa_{(1-y)}N$, and $Al_xGa_{(1-x)}N$, wherein $0 \leq x \leq 1$ and $0 \leq y \leq 1$.

4. The semiconductor material of claim 3, wherein the concentration of gallium in the transition layer is graded.

5. The semiconductor material of claim 3, wherein x and/or y is varied from a first value at a back surface of the transition layer to a second value at a front surface of the transition layer, wherein the back surface is closer to the substrate than the front surface.

6. The semiconductor material of claim 5, wherein the sum of the value of x and the value of y at the back surface is greater than 0.4.

7. The semiconductor material of claim 5, wherein the sum of the value of x and the value of y at the back surface is greater than 0.8.

8. The semiconductor material of claim 5, wherein the transition layer comprises $Al_xIn_{(1-x)}N$ at the back surface of the transition layer in contact with the silicon substrate, wherein $0 \leq x \leq 1$.

9. The semiconductor material of claim 5, wherein the sum of the value of x and the value of y at the front surface is less than 0.3.

10. The semiconductor material of claim 5, wherein the transition layer comprises GaN at a front surface of the transition layer in contact with the gallium nitride material layer and is free of gallium at a back surface of the transition layer in contact with the substrate.

11. The semiconductor material of claim 3, wherein the transition layer comprises $Al_xGa_{(1-x)}N$.

12. The semiconductor material of claim 3, wherein the value of x decreases in a direction away from the silicon substrate.

13. The semiconductor material of claim 3, wherein the value of y remains constant across the transition layer.

14. The semiconductor material of claim 1, wherein the transition layer comprises a superlattice.

15. The semiconductor material of claim 14, wherein the superlattice includes a series of alternating $Al_xIn_yGa_{(1-x-y)}N$ and $Al_aIn_bGa_{(1-a-b)}N$ layers, wherein $0 \leq x \leq 1$, $0 \leq y \leq 1$, $0 \leq a \leq 1$, $0 \leq b \leq 1$.

16. The semiconductor material of claim 15, wherein the of value of x, y, a, and b are constant across respective layers and the thickness of the respective layers is varied across the transition layer.

17. The semiconductor material of claim 1, wherein the transition layer has a thickness between about 0.03 micron and about 20 microns.

18. The semiconductor material of claim 1, wherein the gallium nitride material layer comprises GaN.

19. The semiconductor material of claim 1, wherein the gallium nitride material layer comprises $Al_xIn_yGa_{(1-x-y)}N$, wherein $0 \leq x \leq 1$ and $0 \leq y \leq 1$.

20. The semiconductor material of claim 1, wherein the gallium nitride material layer has a thickness of greater than 0.75 micron.

21. The semiconductor material of claim 1, wherein the gallium nitride material layer has a crack level of less than 0.005 $\mu m/\mu m^2$.

22. The semiconductor material of claim 1, wherein the gallium nitride material layer has a crack level of less than 0.001 $\mu m/\mu m^2$.

23. The semiconductor material of claim 1, wherein the gallium nitride material layer is substantially free of cracks.

24. The semiconductor material of claim 1, wherein the gallium nitride material layer is monocrystalline.

25. The semiconductor material of claim 1, wherein the silicon substrate has a thickness of greater than 250 micron.

26. The semiconductor material of claim 1, wherein the silicon substrate is textured.

27. The semiconductor material of claim 1, wherein the intermediate layer comprises $Al_xIn_yGa_{(1-x-y)}N$, $In_yGa_{(1-y)}N$, or $Al_xGa_{(1-x)}N$, wherein $0 \leq x \leq 1$ and $0 \leq y \leq 1$.

28. The semiconductor material of claim 1, wherein the silicon substrate comprises a silicon wafer.

29. A method of producing a semiconductor material comprising:

forming an intermediate layer comprising aluminum nitride, an aluminum nitride alloy, or a gallium nitride alloy directly on a silicon substrate;

forming a compositionally-graded transition layer over the intermediate layer; and forming a gallium nitride material layer over the transition layer, wherein the semiconductor material forms a FET.

30. The method of claim 29, wherein the transition layer comprises an alloy of gallium nitride selected from the group consisting of $Al_xIn_yGa_{(1-x-y)}N$, $In_yGa_{(1-x)}N$, wherein $0 \leq x \leq 1$ and $0 \leq y \leq 1$.

31. The method of claim 29, wherein the concentration of gallium in the transition layer is graded.

32. The method of claim 29, wherein the value of x decreases in a direction away from the silicon substrate.

33. The method of claim 29, wherein the transition layer comprises $Al_xGa_{(1-x)}N$, wherein $0 \leq x \leq 1$.

34. The method of claim 29, wherein the transition layer comprises a superlattice including a series of alternating $Al_xIn_yGa_{(1-x-y)}N/Al_aIn_bGa_{(1-a-b)}N$ layers, wherein $0 \leq x \leq 1$, $0 \leq y \leq 1$, $0 \leq a \leq 1$, $0 \leq b \leq 1$.

35. The method of claim 29, wherein the gallium nitride material layer comprises GaN.

36. The method of claim 29, wherein the gallium nitride material layer comprises $Al_xIn_yGa_{(1-x-y)}N$, wherein $0 \leq x \leq 1$ and $0 \leq y \leq 1$.

37. The method of claim 29, further comprising processing the semiconductor material to form at least one semiconductor device.

38. The method of claim 29, wherein the gallium nitride material layer has a crack level of less than 0.005 $\mu m/\mu m^2$.

39. The method of claim 29, wherein the gallium nitride material layer has a crack level of less than 0.001 $\mu m/\mu m^2$.

40. The method of claim 29, wherein the gallium nitride material layer is substantially free of cracks.

41. The method of claim 29, wherein the gallium nitride material layer is monocrystalline.

42. The semiconductor material of claim 1, wherein the transition layer comprises a gallium nitride alloy.

43. The semiconductor material of claim 1, wherein the composition of the transition layer is graded across the entire thickness of the transition layer.

44. The semiconductor material of claim 1, wherein the composition of the transition layer is graded only across a portion of the thickness of the transition layer.

45. The semiconductor material of claim 1, wherein the transition layer is formed directly on the intermediate layer.

46. The semiconductor material of claim 1, further comprising a second intermediate layer formed over the first intermediate layer.

47. The semiconductor material of claim 46, wherein the transition layer is formed directly on the second intermediate layer.

48. The semiconductor material of claim 46, wherein the second intermediate layer is formed over the transition layer.

49. The semiconductor material of claim 48, wherein the gallium nitride material layer is formed directly on the second intermediate layer.

50. The semiconductor material of claim 48, wherein the transition layer is formed directly on the intermediate layer and the second intermediate layer is formed directly on the transition layer and the gallium nitride material layer is formed directly on the second intermediate layer.

51. The semiconductor material of claim 1, wherein the gallium nitride material layer is formed directly on the transition layer.

52. The semiconductor material of claim 1, wherein the transition layer is formed directly on the intermediate layer and the gallium nitride material layer is formed directly on the transition layer.

53. The semiconductor material of claim 27, wherein the sum of x+y is greater than 0.8.

54. A The semiconductor material of claim 1, wherein the intermediate layer comprises aluminum nitride.

55. The semiconductor material of claim 1, wherein the intermediate layer has a thickness between about 0.01 micron and 2.0 microns.

56. The semiconductor material of claim 1, wherein the gallium nitride material layer includes an intrinsic gallium nitride layer and an $Al_xGa_{(1-x)}N$ layer formed on the intrinsic gallium nitride layer, wherein $0 \leq x \leq 1$.

57. The semiconductor material of claim 56, wherein the $Al_xGa_{(1-x)}N$ layer comprises 10–40 percent aluminum by weight.

58. The semiconductor material of claim 1, wherein the silicon substrate is a (100) substrate.

59. The method of claim 1, wherein the transition layer comprises a gallium nitride alloy.

60. The method of claim 1, wherein the composition of the transition layer is graded across the entire thickness of the transition layer.

61. The method of claim 29, wherein the composition of the transition layer is graded only across a portion of the thickness of the transition layer.

62. The method of claim 29, wherein the transition layer is formed directly on the intermediate layer.

63. The method of claim 29, further comprising forming a second intermediate layer over the first intermediate layer.

64. The method of claim 63, wherein the transition layer is formed directly on the second intermediate layer.

65. The method of claim 63, wherein the second intermediate layer is formed over the transition layer.

66. The method of claim 49, wherein the gallium nitride material layer is formed directly on the second intermediate layer.

67. The method of claim 63, wherein the transition layer is formed directly on the intermediate layer and the second intermediate layer is formed directly on the transition layer and the gallium nitride material layer is formed directly on the second intermediate layer.

68. The method of claim 29, wherein the gallium nitride material layer is formed directly on the transition layer.

69. The method of claim 29, wherein the transition layer is formed directly on the intermediate layer and the gallium nitride material layer is formed directly on the transition layer.

70. The method of claim 31, wherein the sum of x+y is greater than 0.8.

71. The method of claim 29, wherein the intermediate layer comprises aluminum nitride.

72. The method of the intermediate layer has a thickness between about 0.01 micron and 2.0 microns.

73. The method of claim 29, wherein the gallium nitride material layer includes an intrinsic gallium nitride layer and an $Al_xGa_{(1-x)}N$ layer formed on the intrinsic gallium nitride layer, wherein $0 \leq x \leq 1$.

74. The method of claim 73, wherein the $Al_xGa_{(1-x)}N$ layer comprises 10–40 percent aluminum by weight.

75. The method of claim 29, wherein the silicon substrate is a (100) substrate.

* * * * *

UNITED STATES PATENT AND TRADEMARK OFFICE
CERTIFICATE OF CORRECTION

PATENT NO. : 6,617,060 B2
DATED : September 9, 2003
INVENTOR(S) : Weeks Jr. et al.

It is certified that error appears in the above-identified patent and that said Letters Patent is hereby corrected as shown below:

Delete FIGS. 2a, 2b and 2c and Figs. 2d, 2e and 2f and substitute therefot the figures, consisting of Figs. 2a, 2b and 2c and Figs. 2d, 2e and 2f.

Signed and Sealed this

Twenty-fourth Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,617,060 B2
DATED : September 9, 2003
INVENTOR(S) : Weeks, Jr. et al.

It is certified that error appears in the above-identified patent and that said Letters Patent is hereby corrected as shown below:

Column 13,
Line 5, change "PET" to -- FET --.

Column 14,
Line 28, change "$In_yGa_{(1-x)}N$" to -- $In_yGa_{(1-y)}N$ --.
Line 28, before "wherein" add -- and $Al_xGa_{(1-x)}$ --.
Line 33, change "claim 29" to -- claim 30 --.
Line 35, change "claim 29" to -- claim 30 --.

Column 15,
Line 23, delete "A".
Lines 37 and 39, change "claim 1" to -- claim 29 --.

Column 16,
Line 12, change "claim 49" to -- claim 65 --.
Line 26, change "claim 31" to -- claim 30 --.
Line 30, after "The method of" add -- claim 29, wherein --.

Signed and Sealed this

Thirteenth Day of September, 2005

JON W. DUDAS
*Director of the United States Patent and Trademark Office*